United States Patent [19]

Itoh et al.

[11] Patent Number: 5,160,998
[45] Date of Patent: Nov. 3, 1992

[54] SEMICONDUCTOR DEVICE AND METHOD OF MANUFACTURING THE SAME

[75] Inventors: Junichi Itoh, Inagi; Kazuyuki Kurita, Yokohama, both of Japan

[73] Assignee: Fujitsu Limited, Kanagawa, Japan

[21] Appl. No.: 780,564

[22] Filed: Oct. 21, 1991

Related U.S. Application Data

[63] Continuation of Ser. No. 233,108, Aug. 15, 1988, abandoned.

[30] Foreign Application Priority Data

Aug. 18, 1987 [JP] Japan ............................ 62-203483

[51] Int. Cl.$^5$ .......................................... H01L 29/34
[52] U.S. Cl. ..................................... 257/760; 257/633
[58] Field of Search .................... 357/71, 54, 52, 40, 357/65

[56] References Cited

U.S. PATENT DOCUMENTS

| | | | |
|---|---|---|---|
| 4,135,954 | 1/1979 | Chang et al. | 357/54 X |
| 4,365,264 | 12/1982 | Mukai et al. | 357/52 X |
| 4,446,194 | 5/1984 | Candelaria et al. | 357/54 |
| 4,455,568 | 6/1984 | Shiota | 357/54 |
| 4,654,689 | 3/1987 | Fujii | 357/40 |
| 4,825,277 | 4/1989 | Mattox et al. | 357/54 X |

FOREIGN PATENT DOCUMENTS

| | | | |
|---|---|---|---|
| 0152794 | 8/1985 | European Pat. Off. | 357/71 |
| 0252179A1 | 1/1988 | European Pat. Off. | |
| 51-117887 | 10/1976 | Japan | |
| 52-28870 | 3/1977 | Japan | |
| 52-115785 | 9/1977 | Japan | |
| 55-19850 | 2/1980 | Japan | |
| 57-45931 | 3/1982 | Japan | |
| 0190043 | 11/1983 | Japan | 357/71 |
| 61-279132 | 12/1986 | Japan | |

OTHER PUBLICATIONS

Ghandhi, S. *VLSI Fabrication Principles*, John Wiley and Sons, 1983, pp. 582–585.

Claassen, W. A. P. "Ion Bombardment-Induced Mechanical Stress in Plasma-Enhanced Deposited Silicon Nitride and Silicon Oxynitride Films." *Plasma Chemistry and Plasma Processing*, vol. 7, No. 1 (Mar. 1987), pp. 109–124.

Machida, Katsuyuki and Hideo Oikawa. "New Planarization Technology Using Bias-ECR Plasma Deposition." *Japanese Journal of Applied Physics* supplements 17th Conf. on Solid State Devices and Materials Aug. 25–27, 1985, pp. 329–332.

Patent Abstracts of Japan, vol. 6, No. 119 (E-116) [997], Jul. 3 1982; and JP-A-57 45 931 (Fujitsu K. K.) Mar. 16, 1982.

Patent Abstracts of Japan, vol. 11, No. 138 (E-503)[2585], May 2, 1987; and JP-A-61 279 132 (Sony Corp.) Dec. 9, 1986.

Extended Abstracts, vol. 87-1, No. 1, Spring 1987, pp. 366–367, No. 254, Philadelphia, Pa. U.S.; M. Doki et al.: "ECR Plasma CVD of Insulator Films–Low Temperature Process for Ulsi–".

Patent Abstracts of Japan, vol. 11, No. 390 (E-567) [2837], Dec. 19, 1987; and JP-A-62 154 642 (Matsushita Electronics Corp.) Sep. 7, 1987.

*Primary Examiner*—Andrew J. James
*Assistant Examiner*—Sara W. Crane
*Attorney, Agent, or Firm*—Nikaido, Marmelstein, Murray & Oram

[57] ABSTRACT

A semiconductor device including a semiconductor substrate; a metal wiring layer formed on the semiconductor substrate; a first insulation layer formed on the metal wiring layer, the first insulation layer being formed by a tensile stress insulation layer having a contracting characteristic relative to the substrate; and a second insulation layer formed on the first insulation layer, the second insulation layer being formed by a compressive stress insulation layer having an expanding characteristic relative to the substrate. The tensile stress insulation layer is produced by thermal chemical vapor deposition or plasma assisted chemical vapor deposition which is performed in a discharge frequency range higher than 2 megahertz; and the compressive stress insulation layer is produced by plasma assisted chemical vapor deposition which is performed in a discharge frequency range lower than 2 megahertz.

5 Claims, 6 Drawing Sheets

| INSULATION INTERLAYERS AND COVER / TEST DATA | 1-1 | 1-2 | 2-1 | 2-2 | 3-1 | 3-2 | COVER | GENERATION OF CRACKS |
|---|---|---|---|---|---|---|---|---|
| I | T | T | T | T | T | T | C | × |
| II | T | T | T | T | C | C | C | ○ |
| III | T | T | T | T | C | T | C | × |
| IV | T | T | C | C | C | C | C | ○ |
| V | T | C | C | C | T | C | C | ○ |

SEMICONDUCTOR DEVICE AND METHOD OF MANUFACTURING THE SAME

This application is a continuation of application Ser. No. 233,108 filed Aug. 15, 1988, abandoned.

BACKGROUND OF THE INVENTION (1) Field of the Invention

The present invention relates to a semiconductor device and a method of manufacturing the same. More particularly, it relates to an improvement of a semiconductor device having metal wiring layers and insulation layers formed on the metal wiring layers, and an improvement of the method of manufacturing the same.

(2) Description of the Related Art

Generally, in the conventional semiconductor device of the above type, the insulation layers formed on the metal wiring layers (e.g., aluminum wiring layers) are produced by chemical vapor deposition using insulation material such as phosphor silicated glass (PSG).

In this method, however, during the formation of the above insulation layers, problems have arisen such as a disconnection of the metal wiring layers due to stress migration due to the effect of stress generated in the insulation layers, and cracks in the insulation layers.

The present invention is intended to solve the above-mentioned problems, and the main object of the present invention is to effectively prevent not only the disconnection of the metal wiring layers due to stress migration but also a generation of cracks in the insulation layers.

SUMMARY OF THE INVENTION

To attain the above-mentioned object, according to one aspect of the present invention, there is provided a semiconductor device comprising a semiconductor substrate; a metal wiring layer formed on the semiconductor substrate; a first insulation layer formed on the metal wiring layer, the first insulation layer being formed by a tensile stress insulation layer having a contracting characteristic relative to the substrate; and a second insulation layer formed on the first insulation layer, the second insulation layer being formed by a compressive stress insulation layer having an expanding characteristic relative to the substrate.

Also, according to another aspect of the present invention, there is provided a semiconductor device comprising a semiconductor substrate; a plurality of metal wiring layers formed on the semiconductor substrate, the plurality of metal wiring layers comprising one or more lower side metal wiring layers having a small wiring width and one or more upper side metal wiring layers having a large wiring width; one or more first insulation layers formed on the respective lower side metal wiring layers, each of the first insulation layers being formed by a tensile stress insulation layer having a contracting characteristic relative to the substrate; and one or more second insulation layers formed on the respective upper side metal wiring layers, each of the second insulation layers being formed by a compressive stress insulation layer having an expanding characteristic relative to the substrate.

In addition, according to the present invention, there are provided methods for manufacturing the above-mentioned semiconductor devices.

Figure 1:
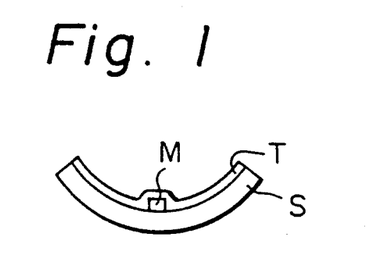
FIG. 1 is a drawing explaining a characteristic of the tensile stress insulation layer.

As above-mentioned, the tensile stress insulation layer has a contracting characteristic relative to the substrate, and thus, when the tensile stress insulation layer T is formed on the semiconductor substrate S as shown in FIG. 1, the tensile stress insulation layer T causes the substrate S to bend in a direction such that the insulation layer T contracts relative to the substrate S (i.e., a direction such that the insulation layer T compresses the metal wiring layer M formed on the substrate S).

Figures 2, 4:
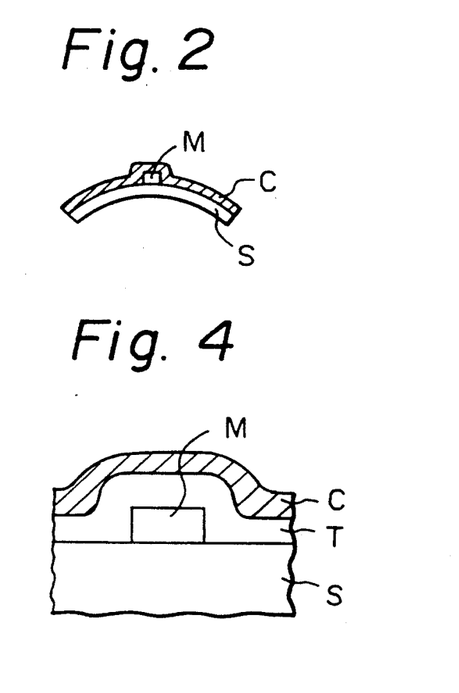
FIG. 2 is a drawing explaining a characteristic of the compressive stress insulation layer.
FIG. 4 is a drawing showing the compressive stress insulation layer formed on the first insulation layer as the second insulation layer.

On the other hand, the compressive stress insulation layer has an expanding characteristic relative to the substrate, and thus, when the compressive stress insulation layer C is formed on the semiconductor substrate S as shown in FIG. 2, the compressive stress insulation layer C causes the substrate S to bend in a direction such that the insulation layer C expands relative to the substrate S (i.e., a direction such that the metal wiring layer M formed on the substrate S is expanded together with the insulation layer C when the metal wiring layer is heated by a current flowing therethrough).

Figure 3:
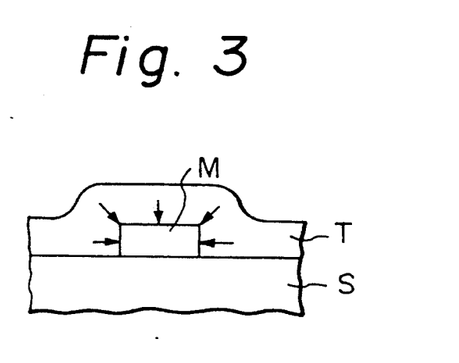
FIG. 3 is a drawing showing the tensile stress insulation layer formed on the metal wiring layer as a first insulation layer.

Thus, according to one aspect of the present invention, by forming the tensile stress insulation layer T on the metal wiring layer M as the first insulation layer, the insulation layer T applies stress to the metal wiring layer M, to compress the metal wiring layer as shown in FIG. 3, and as a result, a disconnection of the metal wiring layer due to stress migration is prevented. Also, by forming the compressive stress insulation layer C on the first insulation layer T as the second insulation layer, as shown in FIG. 4, the compressive stress insulation layer tends to expand together with the expansion of the metal wiring layer when the metal wiring layer is heated, and thus the stress applied by the metal wiring layer to the insulation layer at that time is reduced, and as a result, a generation of cracks in the insulation layer is prevented.

Also, according to another aspect of the present invention, by forming the tensile stress insulation layers on the respective lower side metal wiring layers having a small wiring width (e.g., on the first and the second metal wiring layers), a disconnection of the metal wiring layers having a small wiring width due to stress migration is prevented. Also, by forming the compressive stress insulation layers on the respective upper side metal wiring layers having a large wiring width (e.g., on the third and the fourth metal wiring layers), a generation of cracks in the insulation layers due to the expansion of the metal wiring layers having a large wiring width is prevented. In this connection, with regard to the metal wiring layers having a large wiring width, a disconnection thereof due to stress migration need not be considered.

As described in detail below, the tensile stress insulation layer may be produced by thermal chemical vapor deposition (thermal CVD) or plasma assisted chemical vapor deposition (plasma CVD) performed in a discharge frequency range higher than 2 megahertz. On the other hand, the compressive stress insulation layer may be produced by plasma assisted chemical vapor deposition (plasma CVD) performed in the discharge frequency range lower than 2 megahertz. Also, when the above tensile stress insulation layer or compressive stress insulation layer is formed by a particular plasma assisted chemical vapor deposition such that the above plasma is produced by electron cyclotron resonance (ECR plasma CVD), the surface of the corresponding insulation layer can be made flat, and thus ensure a high reliability of the metal wiring layers formed on the flattened surfaces of the insulation layers.

In this connection, U.S. Pat. No. 4,446,194 discloses a method of forming a dielectric layer having a compressive stress (corresponding to compressive stress insulation layer) on the metal layer and forming a dielectric layer substantially free of compressive stress (corresponding to the tensile stress insulation layer) on the compressive stress insulation layer, to prevent a formation of voids in the metal layers.

But, as shown in the experimental data described in detail below, a semiconductor device according to the present invention (i.e., a semiconductor device comprising a tensile stress insulation layer formed on the metal layer and a compressive stress insulation layer formed on the tensile stress insulation layer) effectively prevents both a disconnection of the metal layers due to stress migration and a generation of cracks in the insulation layers, compared with the device disclosed in the above U.S.P. Namely, according to present invention, the above-mentioned particular advantages can be obtained, which cannot be expected from the above U.S.P.

BRIEF DESCRIPTION OF THE DRAWINGS

FIGS. 5(a) to 5(e) are drawings showing a process for manufacturing a semiconductor device according to a first embodiment of the present invention;

FIGS. 7(a) to 7(d') are drawings showing a process for manufacturing semiconductor devices according to second and third embodiments of the present invention;

FIGS. 8(a) to 8(h') are drawings showing a process for manufacturing a semiconductor device according to a fourth embodiment of the present invention;

DESCRIPTION OF THE PREFERRED EMBODIMENTS

Figure 5A:
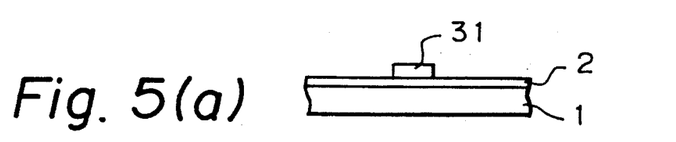
Figure 5B:
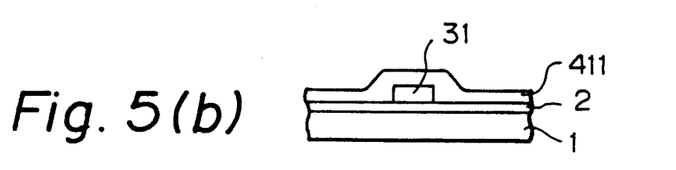
Figure 5C:
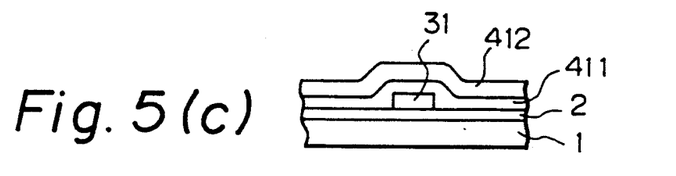

FIGS. 5(a) to 5(e) show a process for manufacturing a semiconductor device according to a first embodiment of the present invention. First, as shown in FIG. 5(a), a first metal wiring layer (e.g., aluminum wiring layer) 31 is formed on a semiconductor substrate 1 (e.g., a silicon substrate) via a silicon insulation film 2 (e.g., a silicon dioxide ($SiO_2$) film). Next, as shown in FIG. 5(b), a tensile stress insulation layer 411 is formed as a first insulation layer on the first metal wiring layer 31. The tensile stress insulation layer 411 functions to compress the metal wiring layer 31, due to the contracting characteristic thereof relative to the substrate, and thus prevents stress migration which will cause a disconnection of the metal wiring layer 31. Then, as shown in FIG. 5(c), a compressive stress insulation layer 412 is formed as a second insulation layer on the tensile stress insulation layer 411. In this connection, the compressive stress insulation layer 412 expands together with the metal wiring layer 31 when the metal wiring layer is heated by a current flowing therethrough, due to the expanding characteristic thereof relative to the substrate, and thus stress applied by the metal wiring layer to the insulation layer at that time is reduced, and as a result, a generation of cracks in the insulation layer is prevented.

In this connection, the tensile stress insulation layer 411 can be formed by thermal chemical vapor deposition (thermal CVD) or plasma assisted chemical vapor deposition (plasma CVD). When the thermal CVD method is used, the insulation material such as phosphor silicated glass (PSG) or silicon dioxide ($SiO_2$) is deposited on the metal wiring layer under the condition of a reduced atmospheric pressure or standard atmospheric pressure, and a processing temperature range higher than 200° C., preferably from 300° C. to 450° C. When the plasma CVD method is used, the insulation material (the reaction gas) such as the above PSG, $SiO_2$, SiON, $Si_3N_4$ or BPSG (boron-phosphor silicated glass), is deposited on the metal wiring layer by supplying a high frequency power having the discharge frequency range higher than 2 megahertz (e.g., 13.56 megahertz) between flat electrodes arranged, for example, in parallel, one of which electrodes is connected to the substrate, under the processing temperature range of from 200° C. to 450° C.

The plasma CVD method is used for forming the compressive stress insulation layer 412, and the insulation material (the reaction gas) such as the above PSG, $SiO_2$, SiON, $Si_3N_4$, or BPSG is deposited on the first insulation layer by supplying a high frequency power having a discharge frequency range lower than 2 megahertz (e.g., 200 kilohertz) between the above electrodes, under a processing temperature range of from 200° C. to 450° C.

Note, the above plasma CVD is of a type other than a plasma CVD wherein the plasma is produced by electron cyclotron resonance (ECR plasma CVD) as described below.

Figure 6:
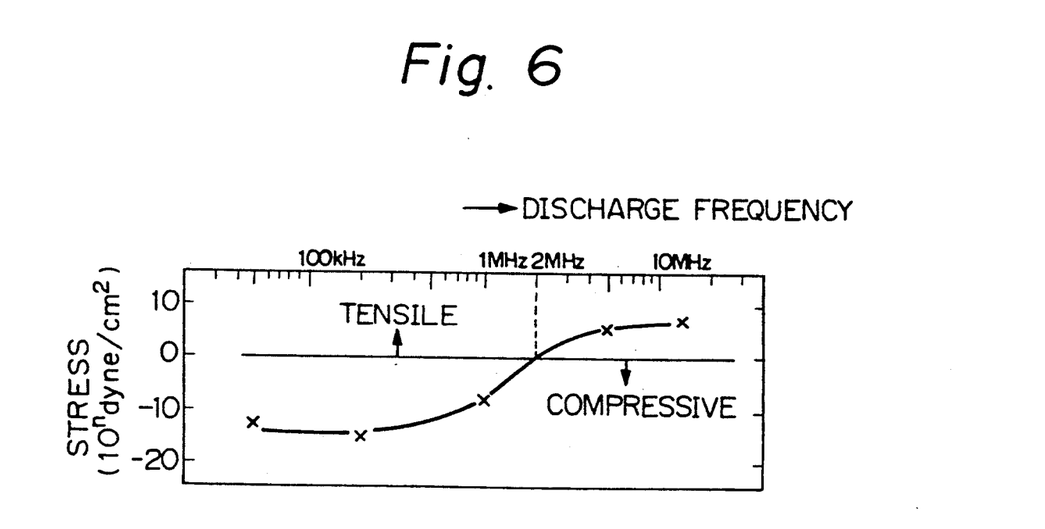
FIG. 6 is a diagram showing how the value of the stress generated in the insulation layer produced by the plasma CVD is changed in accordance with the change of discharge frequency used in the plasma CVD system.

FIG. 6 is a diagram showing how the value of the stress generated in the insulation layer produced by the plasma CVD is changed in accordance with a change in the discharge frequency of the high frequency power supplied from a high frequency generator connected between the above electrodes used in the plasma CVD system. In FIG. 6, the abscissa corresponds to the discharge frequency, and the ordinate corresponds to the value of the stress (using $10^n$ dyne/$cm^2$, where $n=8$ for PSG, and $n=9$ for $Si_3N_4$, as a unit) generated in the insulation layer produced by the plasma CVD. This plasma CVD was performed by using the insulation material (reaction gas) of the above PSG and $Si_3N_4$. The value of the tensile stress generated in the insulation layer is represented as a positive value, and the value of the compressive stress generated in the insulation layer is represented as a negative value.

The value of the stress becomes zero at the point where the discharge frequency is 2 megahertz, and the value of above tensile stress increases in accordance with the increase of the discharge frequency in the frequency range higher than 2 megahertz. On the other hand, the value of the above compressive stress increases in accordance with a decrease of the discharge frequency in the frequency range lower than 2 megahertz. Namely, the tensile stress insulation layer is formed when the plasma CVD is performed at the discharge frequency range higher than 2 megahertz, and the compressive stress insulation layer is formed at the discharge frequency range lower than 2 megahertz. These conditions remain unchanged even when the above ECR plasma CVD is adopted, instead of another type of plasma CVD, for forming the insulation layer.

Figure 5D:
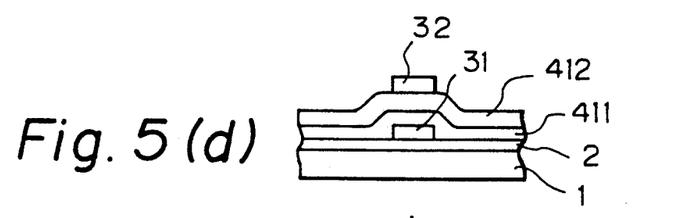

Then, as shown in FIG. 5(d), a second metal wiring layer 32 is formed on the second insulation layer 412. When the above-mentioned steps are repeated, a tensile stress insulation layer 421 and a compressive stress insulation layer 422 are successively formed on the second metal wiring layer 32, and a third metal wiring layer 33 is formed on the above insulation layer 422 corresponding to the second insulation layer.

Figure 5E:
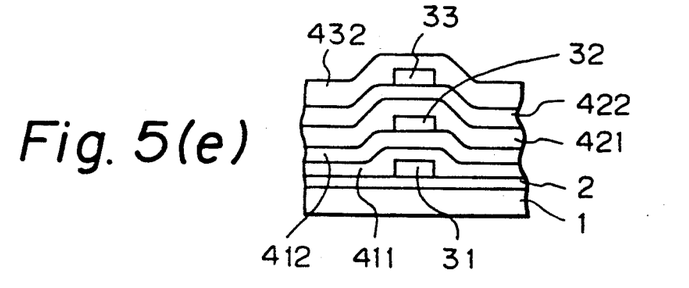

Then, in the above embodiment, the compressive stress insulation layer 432 is formed as a cover on the third metal wiring layer 33, as shown in FIG. 5(e), and subsequently, an anneal processing for the semiconductor device is carried out for about half an hour under a temperature of, for example, 450° C.

Figure 7:
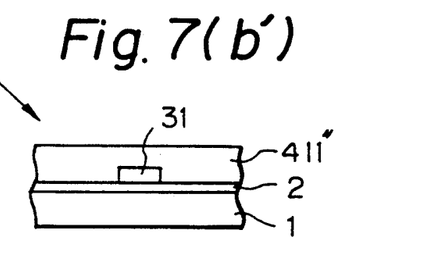
Figure 7A:
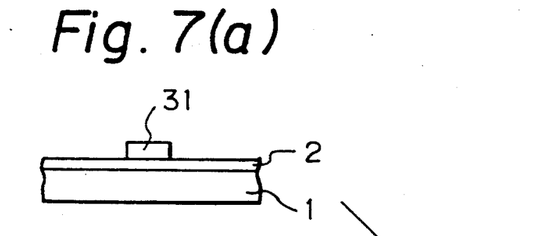

FIGS. 7(a) to 7(d') show a process for manufacturing semiconductor devices according to second and third embodiments of the present invention; the step shown in FIG. 7(a) corresponds to that of the above FIG. 5(a).

Figure 7B:
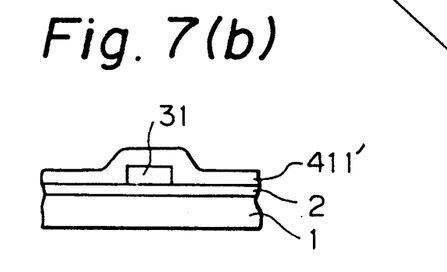
Figure 7C:
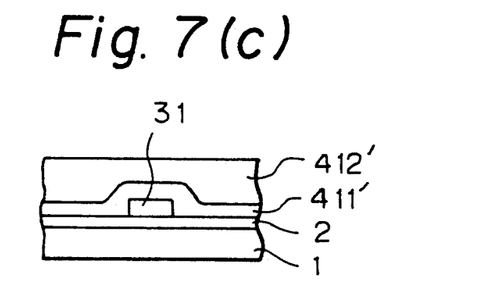

Next, in the second embodiment of the present invention, as shown in FIG. 7(b), a tensile stress insulation layer 411' is formed on the first metal layer 31 as the first insulation layer. This insulation layer 411' may be formed by the same means as used to form the tensile stress insulation layer 411 in the first embodiment. Then, as shown in FIG. 7(c), a compressive stress insulation layer 412' is formed as the second insulation layer on the first insulation layer 411'. The insulation layer 412' is formed so that the surface thereof is made flat.

In this connection, the insulation layer 412' having the flattened surface is formed by the above-mentioned ECR plasma CVD method.

In this case, this ECR plasma CVD is carried out under the condition that the microwave power for producing the ECR Plasma is, for example, 800 watts, and the discharge frequency and the output of the high frequency bias power applied between one electrode connected to the substrate and the other electrode (e.g., the earth electrode) are, for example, 400 kilohertz and 50 to 100 watts, respectively. Namely, as shown in FIG. 6, even when the above ECR plasma CVD is adopted, the compressive stress insulation layer may be produced in a discharge frequency range of the above bias power which is lower than 2 megahertz. Under this condition, the insulation layer 412' is produced by using an insulation material such as $SiO_2$, PSG, SiON, $Si_3N_4$ or BPSG.

Figure 7D:
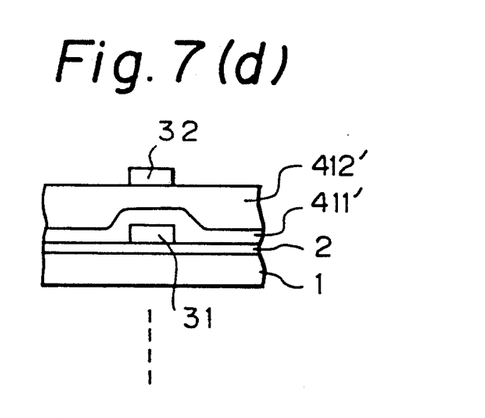

Accordingly, the surface of the insulation layer 412' may be flattened, and then, as shown in FIG. 7(d), a second metal wiring layer 32 formed on the flattened surface of the insulation layer 412'. Further, the above steps for forming the first and second insulation layers and the metal wiring layer may be successively repeated a predetermined number of times.

Also, in the third embodiment of the present invention, after the first step shown in FIG. 7(a), as shown in FIG. 7(b'), a tensile stress insulation layer 411" is formed as the first insulation layer on the first metal wiring layer 31, in such a manner that the surface of the insulation layer 411" is made flat.

As above-mentioned, the insulation layer 411" having a flattened surface, is formed by the above ECR plasma CVD method. In this case, this ECR plasma CVD is carried out under the condition that the above microwave power for producing the ECR plasma is, for example, 800 watts, and the discharge frequency and the output of a high frequency bias power applied between the above electrodes, one of which electrodes is connected to the substrate, are, for example, 13.56 megahertz and 50 to 100 watts, respectively. Namely, as shown in FIG. 6, even when the above ECR plasma CVD is adopted, the tensile stress insulation layer may be produced in the discharge frequency range of the above bias power, which is higher than 2 megahertz. Under this condition, the insulation layer 411" is produced by using the insulation material such as PSG, $SiO_2$, SiON, $Si_3N_4$ or BPSG.

Then, as shown in FIG. 7(c'), a compressive stress insulation layer 412" is formed as the second insulation layer on the flattened surface of the insulation layer 411". The insulation layer 412" may be formed by the same means used to form the compressive stress insulation layer 412 in the first embodiment. The surface of the insulation layer 412", which is formed on the flattened surface of the insulation layer 411" also may be flattened. Then, as shown in FIG. 7(d'), a second metal wiring layer 32 is formed on the flattened surface of the insulation layer 412". Further, the above steps for forming the first and second insulation layers and the metal wiring layer can be successively repeated a predetermined number of times.

Thus, according to the second and third embodiments of the present invention, since each of the metal wiring layers is formed on the flattened surface of the corresponding insulation layer, a high reliability of the metal wiring layers is ensured.

Figure 8:
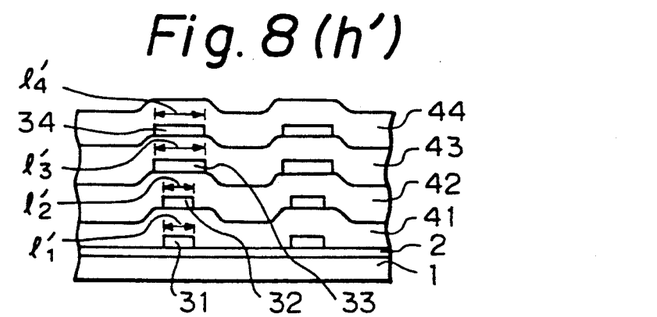
Figure 8A:
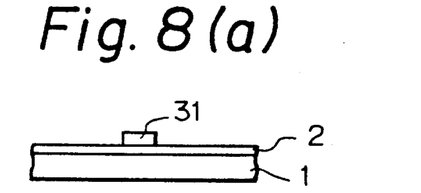

FIGS. 8(a) to 8(h') show a process for manufacturing a semiconductor device according to a fourth embodiment of the present invention. In this embodiment, a plurality of metal wiring layers are provided, the tensile stress insulation layer is formed on each of lower side metal wiring layers having a small wiring width, and the compressive stress insulation layer is formed on each of upper side metal wiring layers having a large wiring width.

Namely, in this embodiment, the tensile stress insulation interlayers 41 and 42 are formed on the first and second metal wiring layers 31 and 32 having small wiring widths $l_1$ and $l_2$, respectively, to prevent disconnection of the metal wiring layers having the small wiring widths due to stress migration. In this connection, the tensile stress insulation layers may be formed by the same means used to form the tensile stress insulation layers in the above first embodiment.

Also, the compressive stress insulation layers (interlayers and a cover) 43, 44, and 45 are formed on the third, fourth, and fifth metal wiring layers 33, 34, and 35 having large wiring widths $l_3$, $l_4$, and $l_5$, respectively. In this connection, it is not necessary to consider disconnection of the metal wiring layers having the large wiring widths $l_3$ to $l_5$, due to stress migration. Accordingly, as above-mentioned, the compressive stress insulation layers are formed on the metal wiring layers having the large wiring widths, to prevent the generation of cracks in the insulation layers, due to expansion of the metal wiring layers having the large wiring widths. The compressive stress insulation layers also may be formed by the same means used to form the compressive stress insulation layers in the above first embodiment.

In this connection, in the above semiconductor device having a plurality of metal wiring layers, one or more metal wiring layers having the small wiring widths (e.g., signal lines) are formed with a high wiring density as the lower side metal wiring layers (in the above case, as the first and second metal wiring layers), and the remaining metal wiring layers having the large wiring widths (e.g., power supply lines) are formed with a low wiring density as the upper side metal wiring layers (in the above case, as the third to fifth metal wiring layers).

Figure 8B:
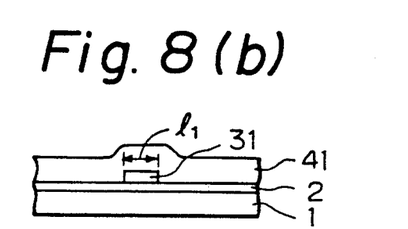

In FIGS. 8(a) to 8(h'), the steps shown in FIG. 8(a) and FIG. 8(b) correspond to those of FIG. 5(a) and FIG. 5(b), respectively.

Figure 8C:
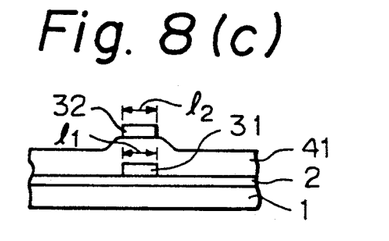
Figure 8D:
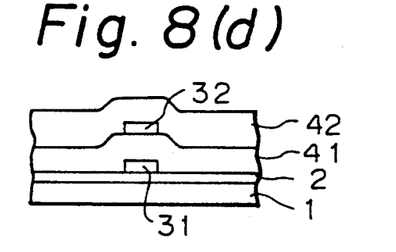
Figure 8E:
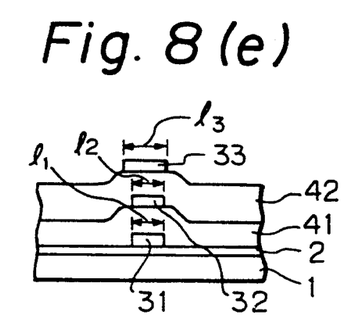
Figure 8F:
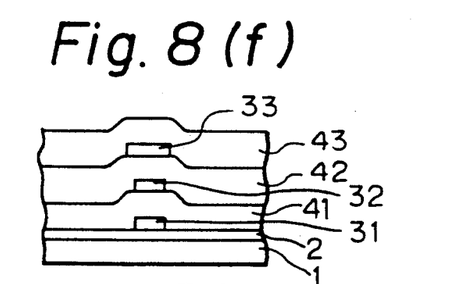
Figure 8G:
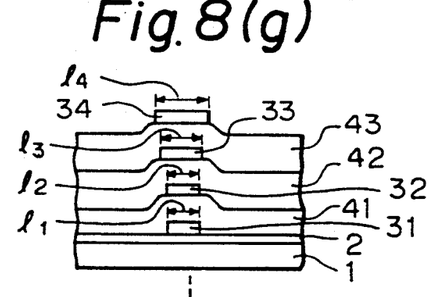
Figure 8H:
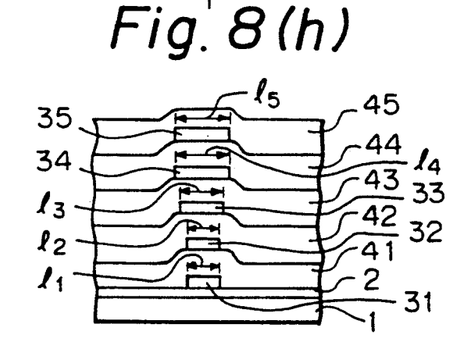

Next, as shown in FIG. 8(c), the second metal wiring layer 32 having the wiring width $l_2$ is formed on the tensile stress insulation interlayer 41, and as shown in FIG. 8(d), the tensile stress insulation interlayer 42 is again formed on the metal wiring layer 32. Next, as shown in FIG. 8(e), the third metal wiring layer 33 having the wiring width $l_3$, which is larger than the above $l_1$, and $l_2$, is formed on the insulation interlayer 42, and as shown in FIG. 8(f), the compressive stress insulation interlayer 43 is then formed on the metal wiring layer 33. Next, as shown in FIG. 8(g), the fourth metal wiring layer 34 having the wiring width $l_4$, which is also larger than $l_1$, and $l_2$, is formed on the insulation interlayer 43. The above steps are repeated a predetermined number of times, and finally, as shown in FIG. 8(h), the compressive stress insulation layer 45 is formed as the cover on the fifth metal wiring layer 35 having, for example, the wiring width $l_5$ which is also larger than $l_1$, and $l_2$.

FIG. 8(h') shows another typical construction of the semiconductor device according to the above fourth embodiment of the present invention. This semiconductor device comprises four metal wiring layers including two lower side metal wiring layers (i.e., the first and second metal wiring layers 31 and 32 having small wiring widths $l_1'$ and $l_2'$, respectively) and two upper side metal wiring layers (i.e., the third and fourth metal wiring layers 33 and 34 having large wiring widths $l_3'$ and $l_4'$, respectively). The tensile stress insulation interlayers 41 and 42 are formed on the above lower side metal wiring layers 31 and 32, respectively, and the compressive stress insulation layers (an interlayer and a cover) 43 and 44 are formed on the above upper side metal wiring layers 33 and 34, respectively. The tensile stress insulation layers and the compressive stress insulation layers may be formed by the same means used to form the tensile stress insulation layers and the compressive stress insulation layers in the above first embodiment.

Figure 9:
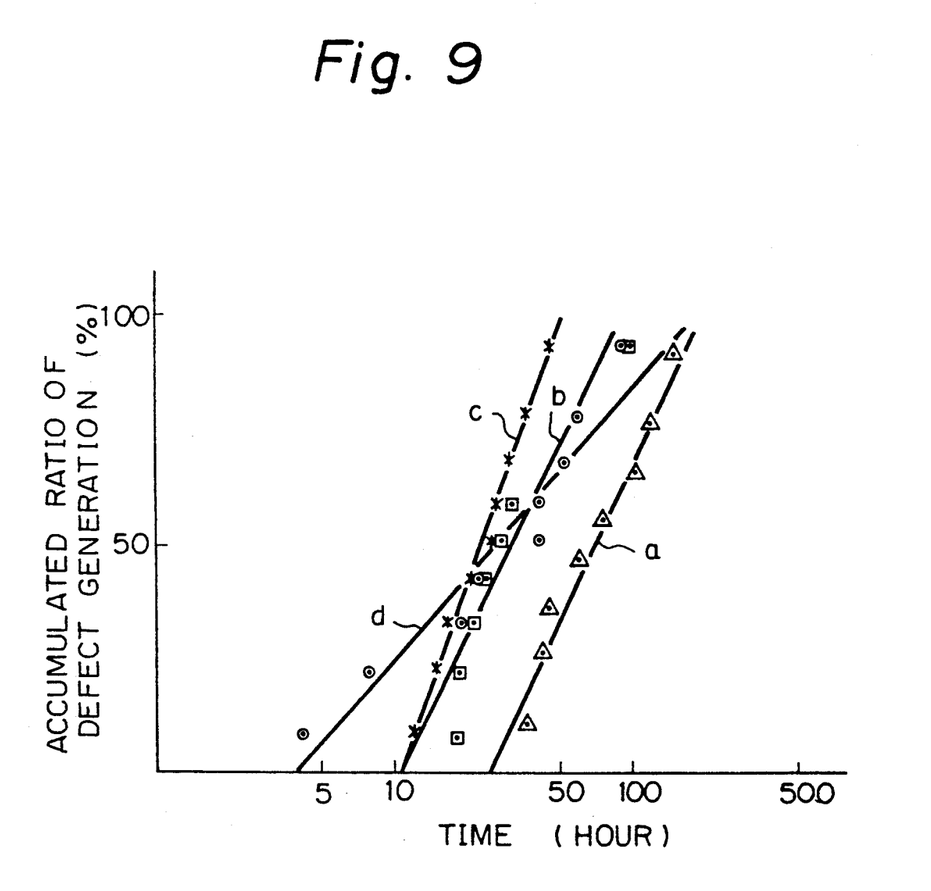
FIG. 9 is a diagram showing experimental data regarding the generation of stress migration in various cases.

FIG. 9 shows experimental data regarding the generation of the above stress migration in various cases. The data was obtained under the condition that a current having a density of $3.0 \times 10^6$ A/cm$^2$ (Amperes/cm$^2$) is made to flow through the aluminum wiring layers having a wiring width of 1.5 $\mu$ (microns) and a wiring thickness of 0.7 $\mu$ (microns), at a temperature of 250° C.

In FIG. 9, the abscissa corresponds to the test time, (in hours), and the ordinate corresponds to an accumulated ratio of the generation of the defect (i.e., the above stress migration), shown as a percentage.

In FIG. 9, marks "*" along a line "C" correspond to test data in the case wherein each of the insulation interlayers is formed only by the tensile stress insulation layer produced by thermal CVD, and marks "o" along a line "d" correspond to test data in the case wherein each of the insulation interlayers is formed only by the compressive stress insulation layer produced by plasma CVD. Further, marks "□" along a line "b" correspond to test data in the case wherein each of the insulation interlayers comprises the compressive stress insulation layer as the first insulation layer and the tensile stress insulation layer formed on the compressive stress insulation layer as the second insulation layer, as shown in the above U.S. Pat. No. 4,446,194, and marks "Δ" along a line "a" correspond to test data in the case wherein each of the insulation interlayers comprises the tensile stress insulation layer as the first insulation layer and the compressive stress insulation layer formed on the tensile stress insulation layer as the second insulation layer, as in the present invention.

As shown in FIG. 9 it is apparent that the construction according to the present invention is remarkably effective for preventing stress migration, compared to other cases.

Figure 10:
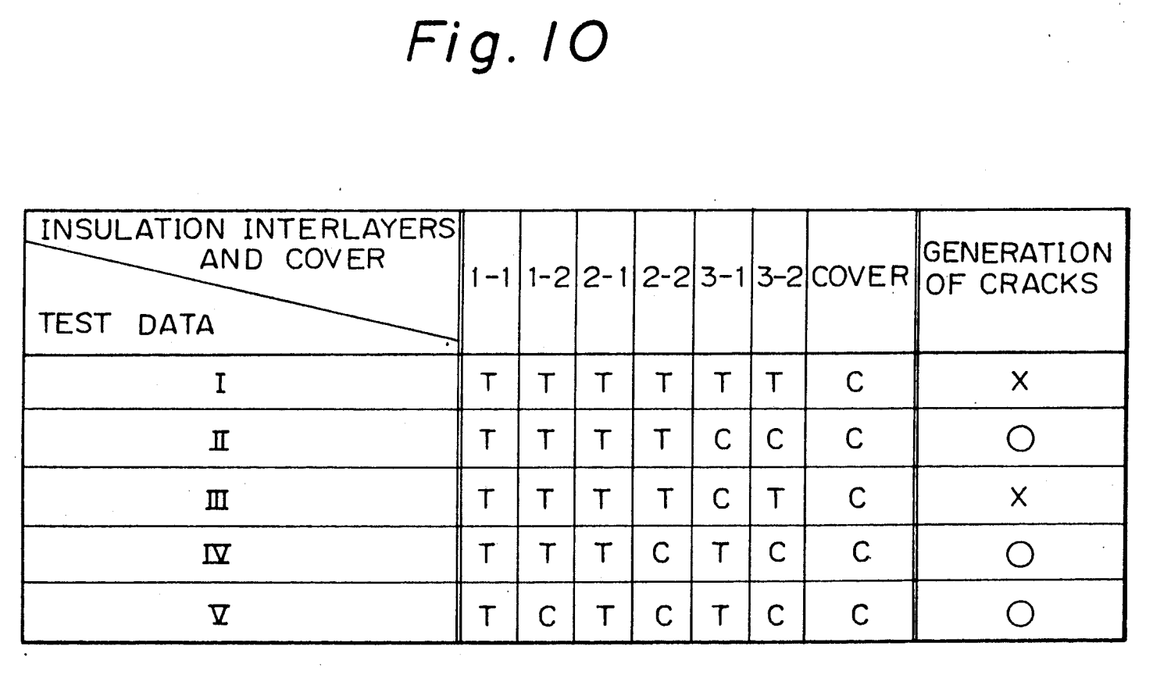
FIG. 10 is a diagram showing experimental data regarding the generation of cracks in the insulation layers in various cases.

FIG. 10 shows experimental data regarding the generation of cracks in the insulation layers in various cases.

In FIG. 10, test data I corresponds to the case wherein the insulation interlayers formed on the first, second, and third metal wiring layers are all formed only by the tensile stress insulation layers T, and only the cover formed on the fourth metal wiring layer is formed by the compressive stress insulation layer C. Also, test data III corresponds to the case wherein the insulation interlayers formed on the first and second metal wiring layers are formed only by the tensile stress insulation layers T, and the insulation interlayer formed on the third metal wiring layer comprises the compressive stress insulation layer C as a first insulation layer 3-1 of the corresponding insulation interlayer and the tensile stress insulation layer T formed on the first insulation layer 3-1 as a second insulation layer 3-2 of the corresponding insulation interlayer, as shown in the above U.S.P., and the cover formed on the fourth metal wiring layer is formed by the compressive stress insulation layer C. These test data I and III show that, according to the above constructions, it is impossible to prevent the generation of cracks in the insulation layers, as shown by marks "X".

On the other hand, test data II corresponds to the case wherein the insulation interlayers formed on the first and second metal wiring layers (i.e., the metal wiring layers having the small wiring width) are formed by the tensile stress insulation layers T, and the insulation interlayer formed on the third metal wiring layer and the cover formed on the fourth metal wiring layer (i.e., the insulation interlayer and the cover formed on the metal wiring layers having the large wiring width) are formed by the compressive stress insulation layers C, as shown in the fourth embodiment of the present invention. Also, test data IV corresponds to the case wherein the insulation interlayer formed on the first metal wiring layer is formed by the tensile stress insulation layer T, and each of the insulation interlayers formed on the second and third metal wiring layers comprises the tensile stress insulation layer T as a first insulation layer 2-1 or 3-1 of the corresponding insulation interlayer and the compressive stress insulation layer C formed on the first insulation layer 2-1 or 3-1 as a second insulation layer 2-2 or 3-2 of the corresponding insulation interlayer, as shown in the first embodiment of the present invention, and the cover formed on the fourth metal wiring layer is formed by the compressive stress insulation layer C. Further, test data V corresponds to the case wherein each of the insulation interlayers formed on the first, second, and third metal wiring layers comprises the tensile stress insulation layer T as a first insulation layer 1-1, 2-1, or 3-1 of the corresponding insulation interlayer and the compressive stress insulation layer C formed on the first insulation layer 1-1, 2-1, or 3-1 as a second insulation layer 1-2, 2-2, or 3-2 of the corresponding insulation interlayer, as shown in the first embodiment of the present invention, and the cover formed on the fourth metal wiring layer is formed by the compressive stress insulation layer C. These test data II, IV, and V show that, according to the constructions of the present invention, the generation of cracks in the insulation layers can be effectively prevented, as shown by marks "o".

We claim:
1. A semiconductor device comprising:
   a) a semiconductor substrate;
   b) an insulation film formed on said semiconductor substrate;
   c) a metal wiring layer formed on said insulation film;
   d) a multilayer structure formed by a plurality of layers, each layer formed in order by
      1) a first insulation layer of each layer covering upper and side surfaces of a metal wiring layer that lies thereunder, said first insulation layer being formed by a tensile stress insulation layer having a contracting characteristic relative to said substrate,
      2) a second insulation layer covering an upper surface of said first insulation layer, said second insulation layer being formed by a compressive stress insulation layer having an expanding characteristic relative to said substrate, and
      3) a metal wiring layer formed on an upper surface of said second insulation layer; and
   e) an insulation layer formed on an uppermost layer of said multilayer structure, said insulation layer formed by a compressive stress insulation layer.

2. A semiconductor device comprising:
   a semiconductor substrate;
   an insulation film covering said semiconductor substrate;
   a plurality of metal wring layers, each metal wiring layer comprising a) at least two first metal wiring layers, a lower side of an initial first metal wiring layer formed on said insulation film and said first metal wiring layers having a first width and b) at least two second metal wiring layers formed above an upper side of said first metal wiring layers and having a second width which is wider than said first width;
   one or more first insulation layers formed on upper and side surfaces of the respective first metal wiring layers, each of said first insulation layers being formed by a tensile stress insulation layer having a contracting characteristic relative to said substrate; and
   one or more second insulation layers formed on upper and side surfaces of the respective second metal wiring layers, each of said second insulation layers being formed by a compressive stress insulation layer having an expanding characteristic relative to said substrate.

3. A semiconductor device according to claim 2, wherein said first metal wiring layers are used as signal lines and said second metal wiring layers are used as power supply lines.

4. A semiconductor device according to claim 2, wherein each of said one or more first and second insulation layers has a flat surface with respect to said semiconductor substrate.

5. A semiconductor device according to claim 4, wherein said first metal wiring layers are used as signal lines and said second metal wiring layers are used as power supply lines.

* * * * *